United States Patent [19]

Nath et al.

[11] Patent Number: 4,513,684
[45] Date of Patent: Apr. 30, 1985

[54] UPSTREAM CATHODE ASSEMBLY

[75] Inventors: Prem Nath, Rochester; Masatsugu Izu, Birmingham, both of Mich

[73] Assignee: Energy Conversion Devices, Inc., Troy, Mich.

[21] Appl. No.: 452,224

[22] Filed: Dec. 22, 1982

[51] Int. Cl.³ ............................................. C23C 13/10
[52] U.S. Cl. .................................. 118/718; 118/719; 118/723; 118/50.1; 427/39
[58] Field of Search ...................... 118/723, 50.1, 718, 118/719, 715; 427/39, 42, 38

[56] References Cited

U.S. PATENT DOCUMENTS

| 4,262,631 | 4/1981 | Kubacki | 118/723 |
| 4,282,267 | 8/1981 | Kuyel | 427/38 |
| 4,301,765 | 11/1981 | Behn et al. | 118/718 |
| 4,398,343 | 8/1983 | Yamazaki | 427/86 X |
| 4,400,409 | 8/1983 | Izu et al. | 427/74 X |
| 4,462,333 | 7/1984 | Nath et al. | 427/39 X |

FOREIGN PATENT DOCUMENTS 57-56923  4/1982  Japan .

Primary Examiner—John D. Smith
Assistant Examiner—Bernard F. Plantz
Attorney, Agent, or Firm—Marvin S. Siskind; Ronald W. Citkowski

[57] ABSTRACT

An upstream cathode system for use with glow discharge deposition apparatus, said apparatus adapted for the production of large area photovoltaic devices. In such apparatus, process gases are commonly introduced into a deposition chamber from a gas manifold disposed on the upstream side of a substrate. As the process gases are drawn across the surface of the substrate, they are continuously disassociated and recombined under the influence of an electromagnetic field developed by a deposition cathode or microwave generator. By providing a precathode system, upstream of the deposition cathode or microwave generator, (1) impurities in the process gases, (2) contaminants from the walls of the deposition chamber and (3) initially disassociated and recombined process gas compositions may be deposited onto and collected from a collection plate disposed upstream of the substrate. In this manner, higher order chains of the process gases are subjected to the upstream electromagnetic field and are therefore more easily broken down by the deposition cathode and deposited onto the substrate in desired lower order chains and compositions so as to provide improved electrical properties.

22 Claims, 7 Drawing Figures

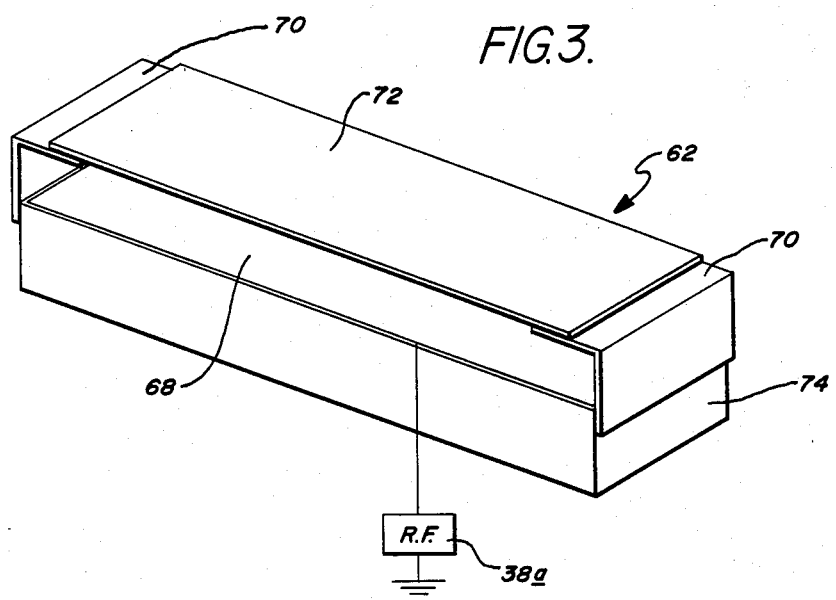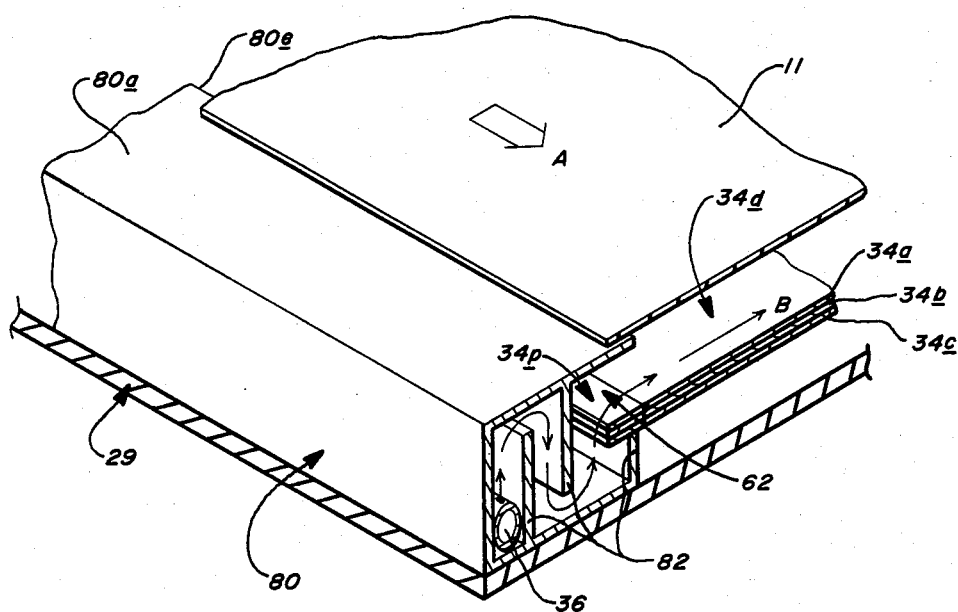

UPSTREAM CATHODE ASSEMBLY

FIELD OF THE INVENTION

The invention relates generally to apparatus for producing improved large area photovoltaic devices either by continuous or batch producing techniques, and more particularly to an upstream cathode system for (1) collecting impurities and contaminants, and (2) initiating the plasma forming and depositing process, whereby a semiconductor film of substantially homogeneous and uniform composition is deposited across the large area surface of the substrate.

BACKGROUND OF THE INVENTION

This invention relates to apparatus for either (1) continuously producing photovoltaic devices on a substrate by depositing successive semiconductor layers in each of at least two adjacent deposition chambers through which the substrate continually travels, or (2) the batch processing production of photovoltaic devices by depositing successive semiconductor layers in each of at least two unconnected deposition chambers into which the substrate is successively transported. Since the composition of the amorphous semiconductor layers is dependent upon the particular process gases introduced into each of the deposition chambers, even small amounts of impurities or contaminants in the semiconductor layers deleteriously effects the efficiencies of photovoltaic devices produced. Therefore, process gases introduced into the deposition chambers, as well as the cleanliness of the deposition chamber itself, must be carefully controlled. To that end, the deposition chamber is sealed to the atmosphere, pumped to low pressures, heated to high temperatures and flushed with a gas such as hydrogen or argon prior to initiation of the glow discharge deposition process.

In glow discharge deposition techniques currently employed, the process gases are introduced at spaced intervals along one of the sides of the deposition cathode. The process gases are drawn by a vacuum pump across the deposition surface of a substrate where an r.f. powered cathode or a microwave generator creates an electromagnetic field in the region defined between the deposition cathode or microwave generator and the substrate (hereinafter referred to as the "plasma region"). The process gases, upon entering the electromagnetic field are disassociated into a plasma adapted to be deposited onto the exposed surface of the substrate.

However, it has now been determined that the semiconductor material produced adjacent the upstream section of the substrate, that section of the substrate first contacted as the process gases flowing across the deposition surface thereof, exhibits electrically inferior characteristics as compared to the semiconductor material produced over the remainder of the downstream deposition surface of the substrate. The electrically inferior characteristics of the upstream semiconductor material can be attributed, inter alia, to (1) impurities in the process gases initially entering the plasma region of the deposition chamber, (2) contamination from the ambient conditions existing in said deposition chamber when the process gases first contact the energized electromagnetic field, and (3) the changing chemical combinations and bonding formations which are formed as the process gases move across the electromagnetic field.

More particularly, despite efforts to procure "pure" process gases, at least trace amounts of impurities are present. In prior glow discharge deposition apparatus, these impurities were deposited as the process gases contacted the electromagnetic field at the upstream side of the substrate. Further, despite pumping and cleansing efforts, contaminants would outgas from the walls of the deposition chamber when the deposition cathode or microwave generator was powered to create the electromagnetic field. These impurities and contaminants would be deposited on the upstream side of the substrate, thereby contributing to the electrically inferior upstream semiconductor material.

It has also been found that the composition of the semiconductor film deposited onto the substrate in such prior deposition apparatus varies with the length of time the process gases are subject to the effects of the electromagnetic field. In other words, the species and compounds formed when the process gases initially come into contact with and are disassociated by the electromagnetic field vary from the species and compounds deposited onto the substrate at a more downstream location. Although, the precise physical and chemical properties of the species and compounds deposited at the downstream location are currently being investigated and have not as yet been fully identified, it is apparent that they provide superior electrical responses (as compared to the responses of the material deposited at the upstream location).

Whether those improved electrical responses are due to the removal of trace impurities from the process gases, the removal of contaminants outgassed from the walls of the deposition chamber, the formation and breakdown of species and compounds, or a combination of the foregoing, it is clear that the properties exhibited by the material deposited onto the substrate is dependent on the length of time spent in the presence of an electromagnetic field. In other words, the overall electrical properties of semiconductor devices produced from semiconductor layers deposited onto a substrate are superior at the downstream segment of the layered substrate.

Accordingly, it is the principle object of the upstream cathode system of the present invention to create an electromagnetic field upstream of the deposition cathode or microwave generator for (1) collecting impurities from the process gases and contaminants from the walls of the deposition chamber and/or (2) subjecting the process gases to a predeposition electromagnetic field prior to their introduction to the deposition electromagnetic field. In this manner, an improved semiconductor film is deposited onto the substrate, said film being of substantially uniform and homogeneous composition across the surface of the substrate and exhibiting improved photovoltaic characteristics.

Recently, considerable efforts have been made to develop systems for depositing amorphous semiconductor alloys, each of which can encompass relatively large areas and which can be doped to form p-type and n-type materials for the production of p-i-n type devices which are, in operation, substantially equivalent to their crystalline counterparts.

It is now possible to prepare amorphous silicon alloys by glow discharge techniques that have (1) acceptable concentrations of localized states in the energy gaps thereof, and (2) provide high quality electronic properties. This technique is fully described in U.S. Pat. No. 4,226,898, Amorphous Semiconductors Equivalent to Crystalline Semiconductors, Stanford R. Ovshinsky and Arun Madan which issued Oct. 7, 1980 and be vapor deposition as fully described in U.S. Pat. No. 4,217,374, Stanford R. Ovshinsky and Masatsugu Izu, which issued on Aug. 12, 1980, under the same title. As disclosed in these patents, it is believed that fluorine introduced into the amorphous silicon semiconductor operates to substantially reduce the density of the localized states therein and facilitates the addition of other alloying materials, such as germanium.

The concept of utilizing multiple cells, to enhance photovoltaic device efficiency, was discussed at least as early as 1955 by E. D. Jackson, U.S. Pat. No. 2,949,498 issued Aug. 16, 1960. The multiple cell structures therein discussed utilized p-n junction crystalline semiconductor devices. Essentially the concept is directed to utilizing different band gap devices to more efficiently collect various portions of the solar spectrum and to increase open circuit voltage (Voc.). The tandem cell device has two or more cells with the light directed serially through each cell, with a large band gap material followed by smaller band gap materials to absorb the light passed through the first cell. By substantially matching the generated currents from each cell, the overall open circuit voltages may be added, thereby making the greatest use of light energy passing through the cells.

It is of obvious commercial importance to be able to mass produce photovoltaic devices by a continuous process. Unlike crystalline silicon which is limited to batch processing for the manufacture of solar cells, amorphous silicon alloys can be deposited in multiple layers over large area substrates to form solar cells in a high volume, continuous processing system. Continuous processing systems of this kind are disclosed, for example, in pending patent applications: Ser. No. 151,301, filed May 19, 1980 for A Method of Making P-Doped Silicon Films and Devices Made Therefrom, now U.S. Pat. No. 4,400,409; Ser. No. 240,493, filed Mar. 16, 1981 for Continuous Systems For Depositing Amorphous Semiconductor Materials, now U.S. Pat. No. 4,410,558; Ser. No. 306,146, filed Sept. 28, 1981 for Multiple Chamber Deposition and Isolation System and Method, now U.S. Pat. No. 4,438,723; and Ser. No. 359,825, filed Mar. 19, 1982 for Method And Apparatus For Continuously Producing Tandem Amorphous Photovoltaic Cells, now U.S. Pat. No. 4,492,181. As disclosed in these applications, a substrate may be continuously advanced through a succession of deposition chambers, wherein each chamber is dedicated to the deposition of a specific material. In making a solar cell of p-i-n type configuration, the first chamber is dedicated for depositing a p-type amorphous semiconductor layer. The second chamber is dedicated for depositing an intrinsic amorphous semiconductor layer and the third chamber is dedicated for depositing an n-type amorphous semiconductor layer.

Whereas, for purposes of mass production, the succession of depositon chambers described hereinabove, is most advantageously employed, a batch processing system may also be used. In such a batch processing system the amorphous semiconductor allow layers can also be deposited in multiple layers over large area substrates to form photovoltaic devices. Batch processing techniques for producing p-i-n type solar cells may proceed in either of two possible manners: (1) a plurality of interlocked deposition chambers are provided wherein a first chamber deposits a p-type semiconductor layer; a second chamber deposits an intrinsic semiconductor layer; and a third chamber deposits an n-type semiconductor layer; or (2) a single deposition chamber is provided which is flushed after the deposition of each layer. In either case, the batch process techniques are accomplished on individual substrate plates in an intermittent mode of operation.

While both systems, batch and continuous, have their own set of operating problems, they both must be kept free of contaminants, which, if deposited with the semiconductor layers onto the deposition surface of the substrate, would harm if not destroy the efficiency and operation of photovoltaic devices produced therefrom. Accordingly, each system must be careful to control the interior environment of its deposition chambers to prevent the influx of contaminants from external sources. After being exposed to the environment, the chambers are pumped, heated and cleansed in an attempt to remove contaminants such as water vapor from the chamber walls. Further, only the purest process gases are purchased for introduction into the chamber and subsequent deposition onto the substrate surface as semiconductor layers. And finally, both systems produce said semiconductor layers by employing very similar operating parameters such as r.f. or microwave power, pressure, process gas mixture, flow rate, temperature, etc.

It should therefore be obvious to those ordinarily skilled in the art that the upstream cathode system of the present invention is equally well-suited for use with batch processing and continuous production apparatus. With both sets of apparatus, it serves the identical function of creating an electromagnetic field upstream of the deposition cathode for (1) collecting impurities from the process gases and contaminants from the walls of the deposition chamber, and (2) initiating the disassociation of process gases into electrically superior species which, when deposited onto the substrate, are of substantially homogeneous chemical composition.

These and other objects and advantages of the present invention will become clear from the drawings, the claims and the description of the invention which follow.

BRIEF SUMMARY OF THE INVENTION

Disclosed herein is an upstream cathode system adapted to be used with either batch-type or continuous-type glow discharge deposition apparatus in which a semiconductor film is deposited onto the exposed surface of a large area substrate in a glow discharge deposition chamber. In such apparatus, process gases introduced into the deposition chamber are directed across the plasma region thereof. The power source is adapted to develop an electromagnetic field for disassociating the process gases into species and depositing the semiconductor film onto the exposed substrate surface. The upstream cathode system of the present invention is preferably disposed upstream of the deposition cathode or microwave generator for forming an upstream electromagnetic field in the presence of which impurities from the process gases and contaminants from the walls of the deposition chamber are removed and collected, and the process gases begin their disassociation and recombination into species. In this manner, an improved semiconductor film of substantially uniform and homogeneous composition is deposited onto the exposed surface of the substrate in the presence of the downstream electromagnetic field, said film being free of process gas impurities and chamber wall contaminants and having been disassociated and recombined into species which, when deposited, exhibit improved electrical properties.

The upstream cathode system includes (1) either an r.f. powered pre-cathode or an extension of the deposition cathode past which the process gases flow prior to contacting the deposition plasma region and (2) a collection plate disposed adjacent to but spaced from the extension or pre-cathode, whereby the system is adapted to develop an upstream electromagnetic field or plasma region. It is in the presence of this upstream electromagnetic field that impurities from the process gases, contaminants from the chamber walls, and partially disassociated and recombined species collect on a surface of the collection plate.

In the embodiment wherein the upstream cathode system of the present invention is used with a continuously moving substrate, the process gases may either be introduced to flow in a direction transverse to the direction of movement of the substrate, or in the same direction as the direction of substrate movement through the deposition chamber. When the process gases flow in a longitudinal direction across the substrate (in the same direction as the direction of substrate travel), the upstream cathode system is operatively disposed in a manner substantially identical to that previously described for a stationary substrate. In both cases, the precathode and collection plate are substantially equal in length to the width of the substrate. However, when the process gases flow transversely across the substrate (in a direction transverse to direction of substrate movement through the deposition chamber), the collection plate and the precathode are substantially equal in length to the length of the deposition cathode and operatively disposed adjacent thereto.

BRIEF DESCRIPTION OF THE DRAWINGS

FIG. 3 is an enlarged perspective view of the upstream cathode system of the present invention, said upstream cathode system adapted for use with batch-type glow discharge deposition apparatus;

FIG. 5 is an enlarged, fragmentary perspective view of the upstream cathode system of the present invention as modified for operative disposition adjacent the deposition cathode, substrate and process gas inlet in continuous glow discharge deposition apparatus wherein the direction of process gas flow in transverse to the direction of substrate movement.

DETAILED DESCRIPTION OF THE DRAWINGS

I. The Photovoltaic Cell

Figure 1:
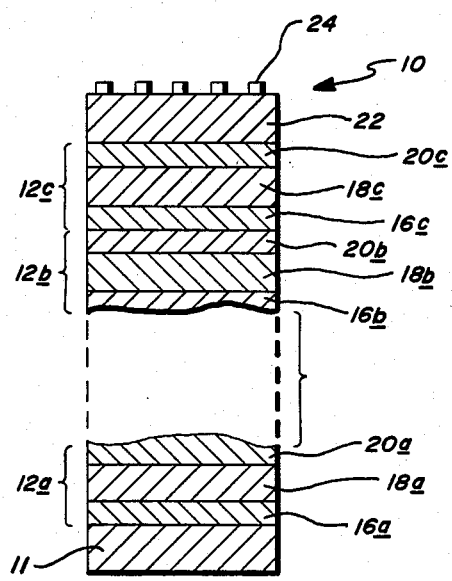
FIG. 1 is a fragmentary, cross-sectional view of a tandem photovoltaic device comprising a plurality of p-i-n type cells, each layer of the cells formed from a semiconductor alloy.

Referring now to the drawings and particularly to FIG. 1, a photovoltaic cell, formed of a plurality of successive p-i-n layers, each of which includes, preferably, an amorphous semiconductor alloy, is shown generally by the numeral 10. It is for the production of this type of photovoltaic device, wherein amorphous semiconductor layers are continuously deposited onto a substrate in isolated deposition chambers, that the upstream deposition apparatus of the present invention was developed.

More particularly, FIG. 1 shows a p-i-n type photovoltaic device such as a solar cell made up of individual p-i-n type cells 12a, 12b and 12c. Below the lowermost cell 12a is a substrate 11 which may be transparent or formed from a metallic material such as stainless steel, aluminum, tantalum, molybdenum or chrome. Although certain applications may require a thin oxide layer and/or a series of base contacts prior to application of the amorphous material, for purposes of this application, the term "substrate" shall include not only a flexible film, but also any elements added thereto by preliminary processing. Also included within the scope of the present invention are substrates formed of glass or a glass-like material on which an electrically conductive electrode is applied.

Each of the cells 12a, 12b and 12c are preferably fabricated with an amorphous semiconductor body containing at least a silicon alloy. Each of the semiconductor bodies includes an n-type conductivity layer 20a, 20b and 20c; an intrinsic layer 18a, 18b and 18c; and a p-type conductivity layer 16a, 16b and 16c. As illustrated, cell 12b is an intermediate cell and, as indicated in FIG. 1, additional intermediate cells may be stacked atop the illustrated cells without departing from the spirit or scope of the present invention. Also, although p-i-n cells are illustrated, the baffle apparatus of this invention may also be used with apparatus adapted to produce single or multiple n-i-p cells.

It is to be understood that following the deposition of the semiconductor alloy layers, a further deposition process may be either performed in a separate environment or as a part of a continuous process. In this step, a TCO (transparent conductive oxide) layer 22 is added. An electrode grid 24 may be added to the device where the cell is of a sufficiently large area, or if the conductivity of the TCO layer 22 is insufficient. The grid 24 shortens the carrier path and increases the conduction efficiency.

II. The Multiple Glow Discharge Deposition Chambers

Figure 2:
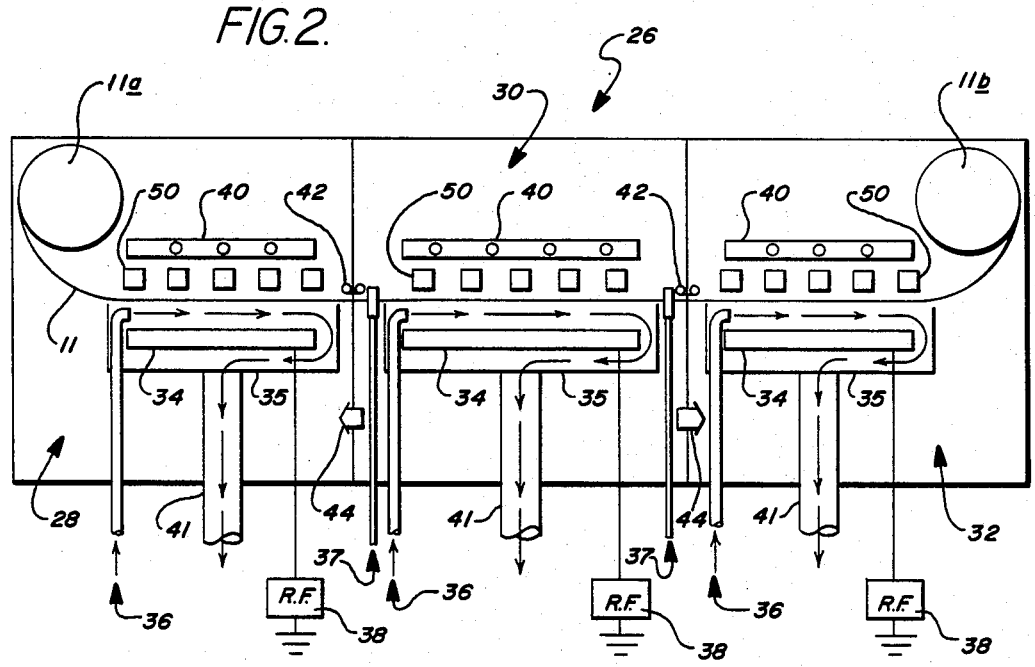
FIG. 2 is a diagrammatic representation of a multiple glow discharge chamber deposition system adapted for use in the continuous production of photovoltaic devices such as the cells shown in FIG. 1.

Turning now to FIG. 2, a diagrammatic representation of multiple glow discharge chamber deposition apparatus for the continuous production of semiconductor cells is generally illustrated by the reference numberal 26. The apparatus 26 includes a plurality of isolated, dedicated deposition chambers, each chamber of which is interconnected by a gas gate through which (1) sweep gases, (2) process gases, and (3) a web of substrate material are adapted to unidirectionally pass.

The apparatus 26 is adapted to mass produce large area, amorphous semiconductor layers of p-i-n configurations onto the deposition surface of a substrate material 11 which is continually fed therethrough. To deposit the semiconductor layers required for producing multiple p-i-n type cells, the apparatus 26 includes at least one triad of deposition chambers. Each triad of deposition chamber comprises: a first deposition chamber 28 in which a p-type conductivity amorphous semiconductor layer is deposited onto the deposition surface of the substrate 11 as the substrate 11 passes therethrough; a second deposition chamber 30 in which an intrinsic semiconductor layer is deposited atop the p-type layer on the deposition surface of the substrate 11 as the substrate 11 passes therethrough; and a third deposition chamber 32 in which an n-type semiconductor layer is deposited atop the intrinsic layer on the deposition surface of the substrate 11 as the substrate 11 passes therethrough. It should be apparent that (1) although, only one triad of deposition chambers has been illustrated, additional triads or additional individual chambers may be added to the apparatus to provide the machine with the capability of producing photovoltaic cells having any number of amorphous p-i-n type semiconductor layers; (2) the upstream cathode system of the present invention is equally applicable to batch-type production apparatus wherein an isolated chamber includes the necessary elements to deposit a semiconductor layer by glow discharge techniques; (3) the substrate supply core 11a and the substrate take-up core 11b are shown in the deposition chambers for illustrative purposes only, while in reality the cores would be housed in separate chambers operatively connected to the deposition chambers; (4) although the glow discharge illustrated herein employs cathodes with r.f. power, other glow discharge apparatus, such as microwave frequency generators, may be employed without departing from the spirit of the present invention; and (5) the cathodes of the upstream cathode systems of the present invention may enjoy any angular orientation, such as vertical.

Each deposition chamber 28, 30 and 32 of the triad is adapted to deposit a single amorphous semiconductor layer, by glow discharge deposition, onto the electrically conductive substrate 11. To that end, each of the deposition chambers 28, 30 and 32 includes: a cathode 34; a shield 35 disposed about each of the cathodes 34; a process gas supply conduit 36; a radio frequency generator 38; a process gas and plasma evacuation conduit 41; a plurality of transversely extending magnetic elements 50; a plurality of radiant heating elements shown schematically as 40 in FIG. 2; and a gas gate 42 operatively connecting the intrinsic deposition chamber to each of the dopant chambers. Additionally, an inert sweep gas conduit 37 is disposed on opposed sides of the intrinsic deposition chamber.

The supply conduits 36 are operatively associated with the respective cathodes 34 to deliver process gas mixtures to the plasma regions created in each deposition chamber between said cathodes 34 and the substrate 11. The cathode shields 35 are adapted to operate in conjunction with the web of substrate material 11 and the evacuation conduit 41 to substantially confine the plasma within the cathode region of the deposition chambers.

The radio frequency or microwave generators 38 operate in conjunction with the cathodes 34, the radiant heaters 40 and the ground substrate 11 to form the plasma by disassociating the elemental reaction gases entering the deposition chambers into deposition species. The deposition species are then deposited onto the bottom surface of the substrate 11 as amorphous semiconductor layers. The substrate 11 is maintained substantially flat by the plurality of rows of magnetic elements 50 which provide an attractive force urging the substrate upwardly, out of its normal sagging path of travel.

Figure 4:
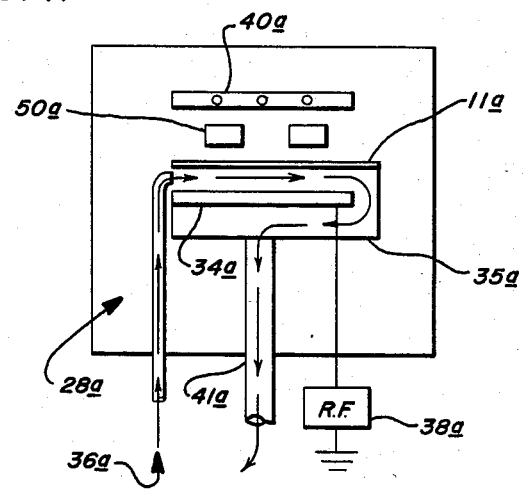
FIG. 4 is a diagrammatic representation of a deposition chamber adapted for use in the batch production of photovoltaic devices, such as the cells shown in FIG. 1.

With reference to FIG. 4, apparatus for the batch-type production of photovoltaic cells in a glow discharge deposition chamber is generally illustrated by the reference numeral 60. The apparatus 60, like the apparatus 26 described hereinabove, is adapted to deposit large area amorphous semiconductor layers of p-i-n type configuration onto the surface of substrate material 11a which is stationarily mounted in the deposition chamber 28a. In the deposition chamber 28a a p-type conductivity layer is deposited onto the surface of the substrate 11a as the substrate is transported thereinto; the chamber 28a is then flushed and an intrinsic semiconductor layer is deposited atop the p-type layer; the chamber 28a is again flushed and an n-type semiconductor layer is deposited atop the intrinsic layer.

In order to deposit a single amorphous semiconductor layer, by glow discharge deposition, onto the electrically conductive substrate 11a, the deposition chamber 28a includes: a cathode 34a, a shield 35a, a process gas supply conduit 36a; a radio frequency generator 38a; a process gas and plasma evacuation conduit 41a; and a plurality of radiant heating elements 40a. The operation of the foregoing elements is substantially identical to the operation of the similarly numbered elements in the continuous production system described with respect to FIG. 2 and, therefore, the description need not be repeated herewith. Note, that while, the sweep gas conduits 37 and the gas gates 42 serve no purpose in a batch processing system, the magnetic assemblies 50a are preferably used to prevent the canoeing or warping of large area substrate plates.

To form the photovoltaic cell 10 illustrated in FIG. 1, whether by a batch or continuous process, a p-type amorphous silicon semiconductor layer is deposited onto the substrate 11 in the deposition chamber 28, an intrinsic amorphous silicon semiconductor alloy layer is deposited atop the p-type layer in the deposition chamber 30 and an n-type amorphous silicon semiconductor alloy layer is deposited atop the intrinsic layer in the deposition chamber 32. As a result, in the preferred embodiment, the apparatus 26 deposits at least three amorphous silicon semiconductor alloy layers onto the substrate 11 with the intrinsic layer deposited in deposition chamber 30 differing in composition from the layers deposited in deposition chambers 28 and 32 by the absence of at least one element which will be referred to as the dopant or doping species.

It is important that each of the semiconductor layers and particularly the intrinsic layer deposited onto a surface of the substrate 11 be of high purity in order to produce high efficiency photovoltaic devices 10. It is therefore necessary to prevent the deposition of semiconductor layers which include either impurities from the process gases or contaminants from the walls of the deposition chambers. It is further advantageous not to deposit a film onto the substrate until the plasma contains the chemical combination, composition and bonding characteristics which will deposit a semiconductor layer exhibiting satisfactory electrical properties. It is to the end of satisfying the above criteria that the upstream cathode assembly of the instant invention is directed.

III. The Upstream Cathode System of the Present Invention

The upstream cathode system of the present invention is fully illustrated in FIGS. 3-6. For ease of disclosure, the system will first be described as deployed in a batch process production machine, then described as deployed in a continuous production machine with process gases introduced transversely and longitudinally to the direction of substrate travel.

A. The Batch Production Machine

Figure 4A:
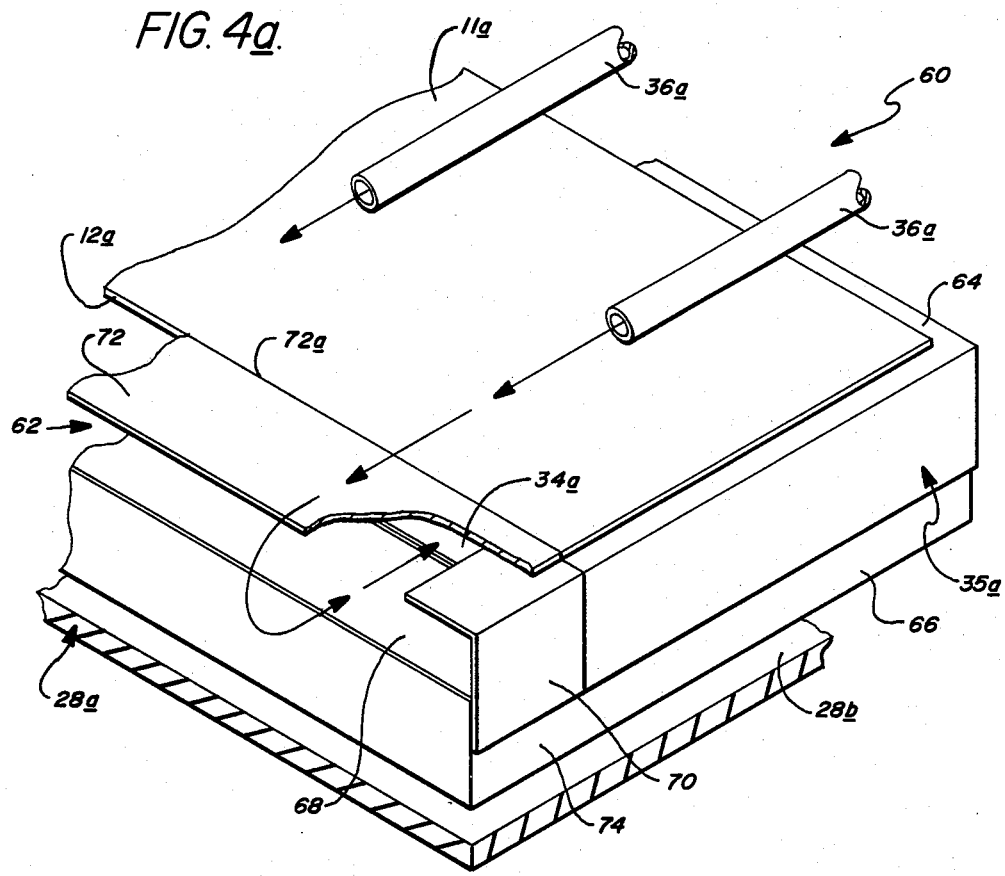
FIG. 4A is an enlarged, fragmentary perspective view of the upstream cathode system shown in FIG. 3 and illustrating the disposition of said system relative to the deposition cathode, substrate and process gas source in batch-type glow discharge deposition apparatus.

FIGS. 3 and 4A depict the upstream cathode system 62 of the present invention as adapted for use with a batch-type production machine 60, said machine having been previously described hereinabove.

Note that the upstream cathode system 62 is illustrated in FIG. 3 without reference to a downstream cathode assembly because the system 62 need not be employed in the same chamber as the deposition cathode 34. In operation and with particular attention to FIG. 4A, process gases are pumped into a deposition chamber such as 28a (a) through supply conduits 36a, (b) across the transverse upper surface of the large area substrate plate 11a, (c) around the upstream side edge 12a of the substrate plate 11a, (d) through the plasma region defined between the lower surface of the substrate plate 11a and the cathode 34a, and expelled along the nondeposited plasma from the deposition chamber through evacuation conduit 41a. The process gases and plasma are substantially confined to the plasma region by the shield 35a which has an upper, generally L-shaped bracket 64 surrounding three sides of the substrate plate 11, said bracket 64 secured to a lower, three-sided enclosure 66. The enclosure 66 is attached to the floor 28b of the deposition chamber 28a to completely isolate the used process gases and nondeposited plasma. The substrate plate 11a rests on the shoulders of the L-shaped bracket 64.

Turning now specifically to FIG. 3, the upstream cathode system 62 may be shaped and dimensioned to substantially conform to the configuration and size of the downstream, deposition cathode assembly. The system 62 includes a precathode 68 powered by an r.f. source (either the same source as or an additional source from the one which powers the deposition cathode 34a); oppositely disposed, L-shaped brackets 70 on the top surface of which a collection plate 72, preferably formed of the same material as the 304 stainless steel substrate, (see FIG. 4A) rests; and a three-sided enclosure 74 to which the L-shaped brackets 70 are secured. The upstream cathode system is operatively disposed so that the downstream edge 72a of the collection plate 72 abuts the upstream edge 12a of the substrate 11a. In a like manner, the downstream edges of the L-shaped brackets 70, the enclosure 74 and the upstream cathode 68 abut the upstream edges of the L-shaped brackets 64, the enclosure 66 and the deposition cathode, respectively so as to prevent process gases or plasma from being trapped between the upstream cathode system 62 and the cathode assembly.

By so forming and disposing the upstream cathode system 62, the operation and gas flow pattern of the deposition cathode system remains unchanged. However, the upstream cathode system operates to create an upstream electromagnetic field and hence an upstream plasma region in which impurities are removed from the process gases and deposited onto the collection plate 72, contaminants are removed from the walls of the deposition chamber 28a and deposited onto the collection plate 72 and the process gases begin their disassociation and recombination, whereby improved semiconductor layers of substantially uniform and homogeneous composition are deposited onto the surface of the substrate plate 11a.

While the foregoing description dealt with the upstream cathode system in relation to an electromagnetic field developed by an r.f. powered cathode, the field may also be developed by a microwave generator without departing from the spirit or scope of the invention. Even when glow discharge deposition is achieved by microwave generation, it is still desirable to remove impurities from the process gases and contaminants from the walls of the deposition chamber and to have a desired chemical combination, composition and bonding of process gases across the entire large area surface of the substrate.

Further, it is preferred that the precathode 68 be powered by an r.f. power source discrete from the source which developes the deposition plasma. By employing a separate precathode power supply, a precathode power density of twice the value of the deposition cathode power density can be used to remove impurities from the process gases and contaminants from the deposition chamber walls.

Finally, note that the precathode system 62, in both the batch process and the continuous process, may be detached and physically spaced from the deposition cathode. The precathode may be either housed in a separate chamber upstream of the deposition chamber; or spaced by a matter of inches upstream of the deposition cathode. In either case, it serves the identical functions, and both dispositions of the precathode may be employed without departing from the spirit of the present invention.

B. The Continuous Process Machine

Figure 6:
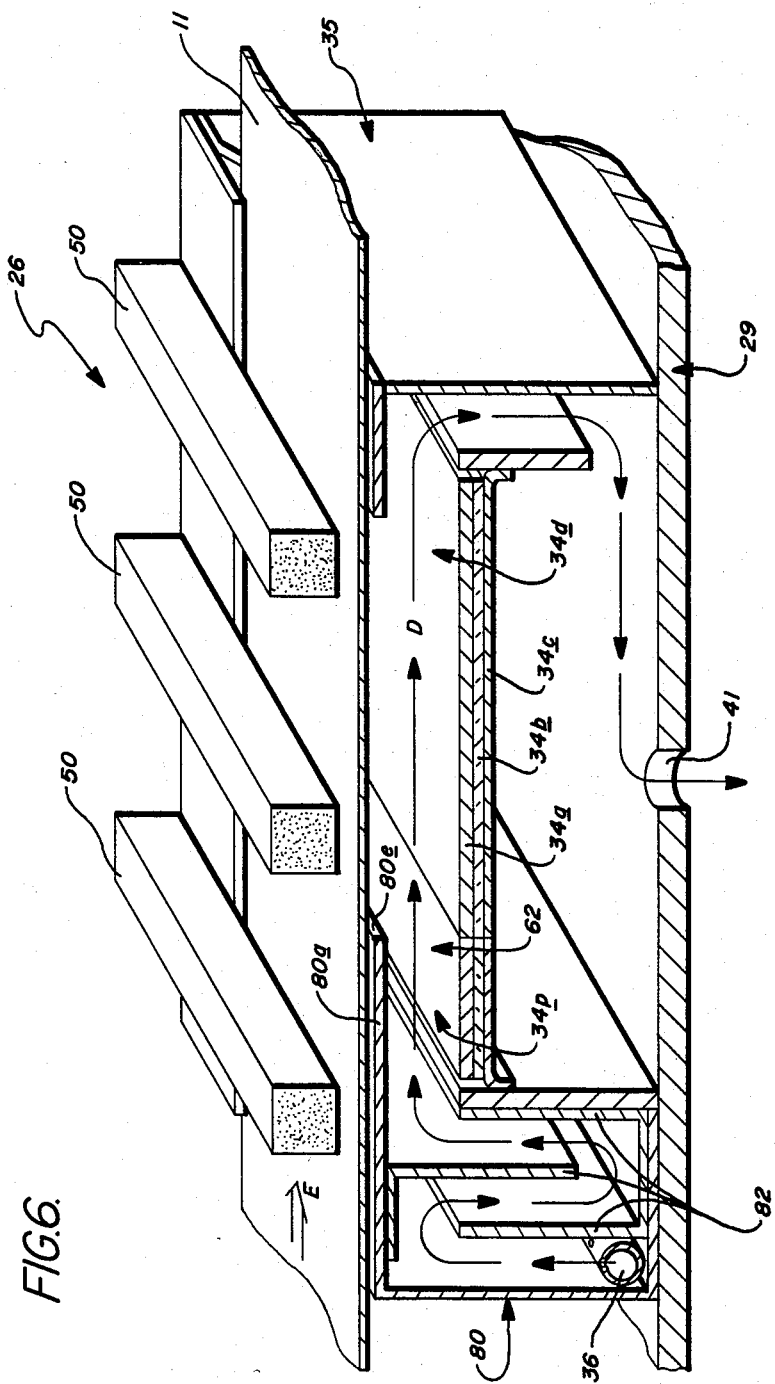
FIG. 6 is an enlarged, fragmentary, perspective view of the upstream cathode system of the present invention as modified for operative disposition adjacent the deposition cathode, substrate and process gas inlet in continuous glow discharge deposition apparatus wherein the direction of process gas flow parallels the direction of substrate movement.

Referring to FIGS. 5 and 6, the upstream cathode system 62 of the present invention is shown disposed for operation with the deposition elements of a continuous production machine such as the one shown in FIG. 2 and detailed hereinabove.

First, viewing the apparatus of FIG. 5, the process gases are directed in a direction of movement transverse (see arrow B) to the direction of movement of the web of the substrate material 11 (see arrow A) through the deposition chamber 28. The existing deposition cathode assembly of such glow discharge deposition apparatus need only be minimally modified to accommodate and function with the instant upstream cathode system 62. Specifically, the deposition chamber 29 includes a baffled process gas supply manifold 80 which comprises a plurality of staggered baffle plates 82 adapted to establish a tortuous path of travel for process gases entering the plasma region of the deposition chamber from an apertured supply conduit 36. Adjacent the deposition cathode 34d in a direction transverse to movement of the web of substrate material 11, is the upstream or precathode 34p of the present invention. The manifold surface 80a is elongated so that the edge 80e thereof is at least coextensive with the width of the precathode 34p. The precathode 34p cooperates with overlying, extended manifold surface 80a to form an upstream plasma region through which the process gases must flow prior to entering the deposition plasma region. The process gases flowing through the upstream plasma region form a glow discharge plasma which is deposited onto the underside of the overhanging manifold surface 80a, or a similarly shaped collection plate secured thereto. The collecting manifold surface 80a has deposited thereonto impurities from the process gases and contaminants from the walls of the deposition chamber 29, while the upstream electromagnetic field begins the chemical disassociation and recombination of process gases, whereby the semiconductor layers deposited onto the exposed surface of the web of substrate material 11 at the downstream deposition cathode 34d is substantially free of impurities and contaminants and of substantially uniform and homogeneous composition.

As to the deposition apparatus illustrated in FIG. 6, note that the direction of flow of process gases (see arrow D) is substantially parallel to the direction of movement of the web of substrate material 11 through the plasma region of the deposition chamber 28 (see arrow E). The upstream cathode system 62 of the present invention is shown operatively disposed with the deposition apparatus illustrated in FIG. 6.

As with the deposition cathode assembly described hereinabove with reference to FIG. 5, the deposition cathode assembly of glow discharge deposition apparatus in which process gases flow in the same direction as the substrate moves through the plasma region, need only be minimally modified to accommodate and function with an upstream cathode system. In describing the deposition apparatus of FIG. 6, the same reference numerals will be applied to elements substantially identical in function and structure to elements described with respect to FIG. 5.

More specifically, a deposition chamber 29 includes a baffled process gas supply manifold 80 which comprises a plurality of staggered baffle plates 82 adapted to establish a tortuous path of travel for process gases entering the plasma region of the deposition chamber from an apertured supply conduit 36. The deposition cathode 34d, and the precathode 34p comprise an upper cathode plate 34a, an intermediate glass insulating sheet 34b and a lower r.f. sheet 34c. Adjacent the deposition cathode 34d is the precathode 34p which extends in the same direction as the direction of movement of the web of substrate material 11.

The supply manifold surface 80a is elongated so that the edge 80e thereof is at least coextensive with the width of the precathode 34p. The precathode 34p cooperates with the overlying extended manifold surface 80a to form an upstream plasma region through which the process gases must flow prior to entering the deposition plasma region. The process gases flowing through the upstream plasma region form a glow discharge plasma which is deposited onto the underside of the overhanging manifold surface 80a. A removable collection plate could obviously be secured to extended surface 80a, which plate would facilitate cleanup operations, i.e., the periodic removal of deposited film since the extended surface 80a has deposited thereonto impurities from the process gases and contaminants from the walls of the deposition chamber 29. Further, the upstream electromagnetic field developed between the upstream precathode 34d and the overhanging manifold surface 80a initiates the chemical disassociation and recombination of process gases, whereby the semiconductor layers deposited onto the exposed surface of the web of substrate material 11 at the downstream deposition cathode 34d is substantially free of impurities and contaminants and of substantially uniform and homogeneous composition.

Although the foregoing detailed description and the drawings have described the upstream cathode system in terms of a generally parallel, horizontally disposed cathode and collection plate combination, it should be obvious that nonhorizontally disposed cathode-collection plate combinations would operate in a manner identical to that described for the horizontal system.

In operation, it is preferred, although not essential, that the upstream cathode system 62 be energized to develop a cleansing plasma prior to energization of the deposition cathode 34d. In this manner the impurities and contaminants are collected on the upstream collection surface rather than deposited onto the substrate 11.

It should be understood that the present invention is not limited to the precise structure of the illustrated embodiments. It is intended that the foregoing description of the presently preferred embodiments be regarded as an illustration rather than as a limitation of the present invention. It is the claims which follow, including all equivalents, which are intended to define the scope of this invention.

What is claimed is:

1. In a glow discharge deposition apparatus which includes a dedicated deposition chamber; a substrate disposed in said chamber; means for introducing process gases into said chamber, said process gases adapted to flow across a surface of the substrate; downstream glow discharge means for developing a deposition plasma region between the substrate and said glow discharge means, whereby the process gases flowing through the deposition plasma region are adapted to be deposited as a semiconductor film onto said surface of the substrate; the improvement comprising, in combination:

upstream glow discharge means disposed upstream of the deposition plasma region, said upstream glow discharge means adapted to provide electromagnetic energy to substantially all of the process gases so as to develop an upstream plasma therefrom in an upstream plasma region for forming a deposit; and, means for collecting said deposit, whereby the semiconductor film deposited onto said surface of the substrate is of substantially homogeneous and uniform chemical composition across the entire surface of the large area substrate.

2. Apparatus as in claim 1, wherein the upstream glow discharge means is further adapted to (1) remove impurities from the process gases and contaminants from the interior walls of the deposition chamber, and (2) initiate the disassociation and recombination of the process gases.

3. Apparatus as in claim 2, further including means for collecting the impurities removed from the process gases, contaminants removed from the chamber walls, and the initially disassociated and recombined process gases.

4. Apparatus as in claim 3, wherein the upstream glow discharge means is an r.f. powered precathode past which the process gases flow prior to contacting the deposition plasma region.

5. Apparatus as in claim 3, wherein the upstream glow discharge means is an extension of the deposition cathode past which the process gases flow prior to being deposited onto the substrate.

6. Apparatus as in claim 3, wherein the upstream glow discharge means is a discrete precathode past which process gases flow prior to being deposited onto the substrate.

7. Apparatus as in claim 3, wherein the collecting means is a collection plate disposed upstream of the deposition region, whereby impurities from the process gases and contaminants from the chamber walls and initially disassociated and recombined process gases are deposited onto a surface of said collection plate.

8. Apparatus as in claim 3, wherein the downstream, glow discharge means is an r.f. powered deposition cathode disposed downstream of the precathode.

9. Apparatus as in claim 3, wherein the downstream glow discharge means is microwave generating means disposed downstream of the precathode.

10. Apparatus as in claim 3, wherein the upstream glow discharge means is pysically spaced from the downstream glow discharge means.

11. In glow discharge deposition apparatus which includes at least one dedicated deposition chamber through which a substrate continually travels; means for introducing process gases into each of said at least one chamber, said process gases adapted to flow across a surface of the continuously moving substrate; downstream glow discharge means for developing a deposition plasma region between the substrate and said glow discharge means whereby a semiconductor film is deposited onto said substrate surface; the improvement comprising, in combination:

upstream glow discharge means disposed upstream of the deposition plasma region, said upstream glow discharge means adapted to provide electromagnetic energy to substantially all of the process gases so as to develop an upstream plasma therefrom, in an upstream plasma region for forming a deposit; and, means for collecting said deposit, whereby the semiconductor film deposited onto said surface of the substrate is of substantially homogeneous and uniform chemical composition across the entire surface of the large area substrate.

12. Apparatus as in claim 11, wherein the upstream glow discharge deposition means is further adapted to (1) remove impurities from the process gases and contaminants from the interior walls of the deposition chamber, and (2) initiate the disassociation and recombination of the process gases.

13. Apparatus as in claim 12, further including means for collecting the impurities removed from the process gases and contaminants from the chamber walls, and the initially disassociated and recombined process gases.

14. Apparatus as in claim 13, wherein the upstream glow discharge means is an r.f. powered precathode past which the process gases flow prior to contacting the deposition plasma region.

15. Apparatus as in claim 13, wherein the upstream glow discharge means is an extension of the deposition cathode past which the process gases flow prior to being deposited onto the substrate.

16. Apparatus as in claim 13, wherein the upstream glow discharge means is a discrete precathode past which the process gases flow prior to being deposited onto the substrate.

17. Apparatus as in claim 13, wherein the collecting means is a collection plate disposed upstream of the deposition plasma region, whereby impurities from the process gases, contaminants from the chamber walls and initially disassociated and recombined process gases are deposited onto a surface of the collection plate.

18. Apparatus as in claim 14, wherein the downstream glow discharge means is an r.f. powered deposition cathode disposed downstream of the precathode.

19. Apparatus as in claim 14, wherein the downstream glow discharge means is a microwave generating means disposed downstream of the precathode.

20. Apparatus as in claim 13, wherein the collecting means is a collection plate masking the upstream portion of the substrate.

21. Apparatus as in claim 20, wherein the collection plate is substantially coextensive in length and width with the length and width of the upstream cathode.

22. Apparatus as in claim 21, wherein the upstream glow discharge means is physically spaced from the downstream glow discharge means.

* * * * *